United States Patent [19]

Martin

[11] Patent Number: 5,180,312
[45] Date of Patent: Jan. 19, 1993

[54] PRESS FIT PINLESS LATCHING SHROUD

[75] Inventor: Edward G. Martin, Plano, Tex.

[73] Assignee: DSC Communications Corporation, Plano, Tex.

[21] Appl. No.: 644,892

[22] Filed: Jan. 23, 1991

[51] Int. Cl.$^5$ .............................................. H01R 23/72
[52] U.S. Cl. ........................................ 439/78; 439/357
[58] Field of Search .................... 439/55, 59–64, 439/78, 83, 350, 357, 358, 571–573

[56] References Cited

U.S. PATENT DOCUMENTS

| | | | |
|---|---|---|---|
| 4,363,530 | 12/1982 | Verhoeven | 439/571 |
| 4,530,553 | 7/1985 | Aujla | 439/260 |
| 4,653,828 | 3/1987 | Szczesny et al. | 439/530 |
| 4,674,812 | 6/1987 | Thom et al. | 439/78 |
| 4,753,601 | 1/1988 | Cobaugh | 29/837 |
| 4,850,894 | 7/1989 | Michot | 439/357 |

FOREIGN PATENT DOCUMENTS 2441670  3/1976  Fed. Rep. of Germany ........ 439/78

Primary Examiner—Neil Abrams
Attorney, Agent, or Firm—Baker & Botts

[57] ABSTRACT

There is disclosed a press-fit pinless latching shroud. The latching shroud retains a connector to a pinfield with two flexible interlocking arms. The connector may be removed from the shroud by the user by disengaging the flexible arms from the connector. The latching shroud mounts to the pinfield by creating an interference fit between a portion of the pinfield and a series of matching holes in its base.

3 Claims, 2 Drawing Sheets

PRESS FIT PINLESS LATCHING SHROUD

TECHNICAL FIELD OF THE INVENTION

This invention relates in general to the field of electrical connectors. More particularly, the present invention relates to an apparatus and method for attaching an electrical connector to a pinfield.

BACKGROUND OF THE INVENTION

Computer hardware designers regularly create systems with subcomponent printed circuit boards ("PCB's"). These PCB's must be connected electrically to other subassembly PCB's and to a common structure or "motherboard" to function properly. Currently, those electrical signals that must be routed on or off a particular PCB are done so on the edge of the PCB in rows of small sockets which are attached along one edge. The electronic circuits on the PCB's terminate at these sockets. The sockets are designed to connect, typically, to two or four rows of pins on a motherboard. The mating pins carry through the motherboard to internal connections, and terminate, on the reverse side, in matching pins. Necessary connections between PCB's on the same motherboard are made internally, within the motherboard. Connections between PCB's on different motherboards are made externally, by attaching cables from pin to pin. Each cable typically contains a dozen individual circuits and terminates in a dozen sockets. Motherboards are designed to accept numerous PCB's resulting in many long rows of dense connecting pins.

At least one problem arises when PCB's from different motherboards are connected to one another by cable. Reliability requirements mandate that each external cable must be secured to the motherboard to avoid inadvertent disconnection.

One approach to this problem could be to increase the normal force between the pin and cable socket. This could be accomplished by decreasing the size of the socket or by increasing the size of the pin. Although the resulting connection would be secure from unintentional separation, it would be equally resistent to intentional separations by the user. The individual pins would also be susceptible to damage by the excess force required to intentionally make or break the connection. As a result, this solution is not practical.

A practical method of securing a cable to a pin field is to mechanically connect or latch the cable to the motherboard. Although the pin to socket normal force may be kept small, the size of the latching mechanism becomes critical on a crowded motherboard. Conventional devices use screws or latching end-brackets to secure the cable to the motherboard. These mechanical means are typically mounted at either end of a pinfield. The presence of the locking mechanism therefore requires that the pin fields have gaps in them to accommodate the hardware.

A related solution is to route the circuits within the motherboard to an area where there are no PCB pins. The routed circuits can then emerge from the motherboard for cable attachment to another set of pins and to the latching hardware.

Neither of these latter two options is completely satisfactory given present component densities. Increasing the parts count results in higher numbers of pins per PCB, more PCB's per motherboard, and little spare room on current motherboards.

Consequently, there is a need in the art for a cable latching mechanism that is secure against inadvertent separation, that allows the user to easily make or break a connection when desired, and that does not require additional space on the motherboard to mount.

SUMMARY OF THE INVENTION

In accordance with the present invention, a pinless shroud is provided that substantially eliminates or reduces disadvantages and problems with prior connectors.

A shroud for retaining a connector on a pinfield is disclosed. The shroud mounts on a portion of the pins by creating an interference fit between the shroud base and the pins. The connector is dematebly connected to the shroud by flexible arms extending from the base. The arms engage the connector when the two are mated. The arms may be expanded to release the connector when desired. A spacing member between the shroud base and the base of the mating pins ensures proper height alignment between the connector and the pinfield.

Accordingly, it as an advantage of the present invention that an improved cable retention mechanism is provided. The mechanism engages a connector with two interlocking arms spaced across the width of the pinfield. The arms flex outward to accept the connector upon insertion and may be easily expanded by the user to remove the same connector. The normal force between the pin and socket can therefore be kept at a low level.

Another advantage of the device is its adaptability to various pin heights. A spacing member is either attached to the base of the device or is inserted between the base and the surface from which the pins protrude. The member may be easily modified to cause the pin to properly protrude from the base of the device. The proper protruding pin length will insure a reliable connection between the pins and connector.

Yet another advantage of the device is its small footprint when installed. The connector may be placed on a continuous row of pins without modification or harm to the pinfield. The device also may be substantially shorter or longer than the connector that it retains.

Yet a final advantage of the device is its general adaptability to various connector widths. A single device is able to retain a single partial-width or full-width connector or a combination of partial-width connectors within the same unit. The disclosed device may also be used in conjunction with other similar devices to retain long connectors which would otherwise be unmanageable with a single shroud.

BRIEF DESCRIPTION OF THE DRAWINGS

A more complete understanding of the present invention may be derived by referring to the detailed description and claims when considered in connection with the accompanying drawings, wherein like reference numbers refer to similar items throughout the drawings, and:

DETAILED DESCRIPTION OF THE INVENTION

Figure 1:
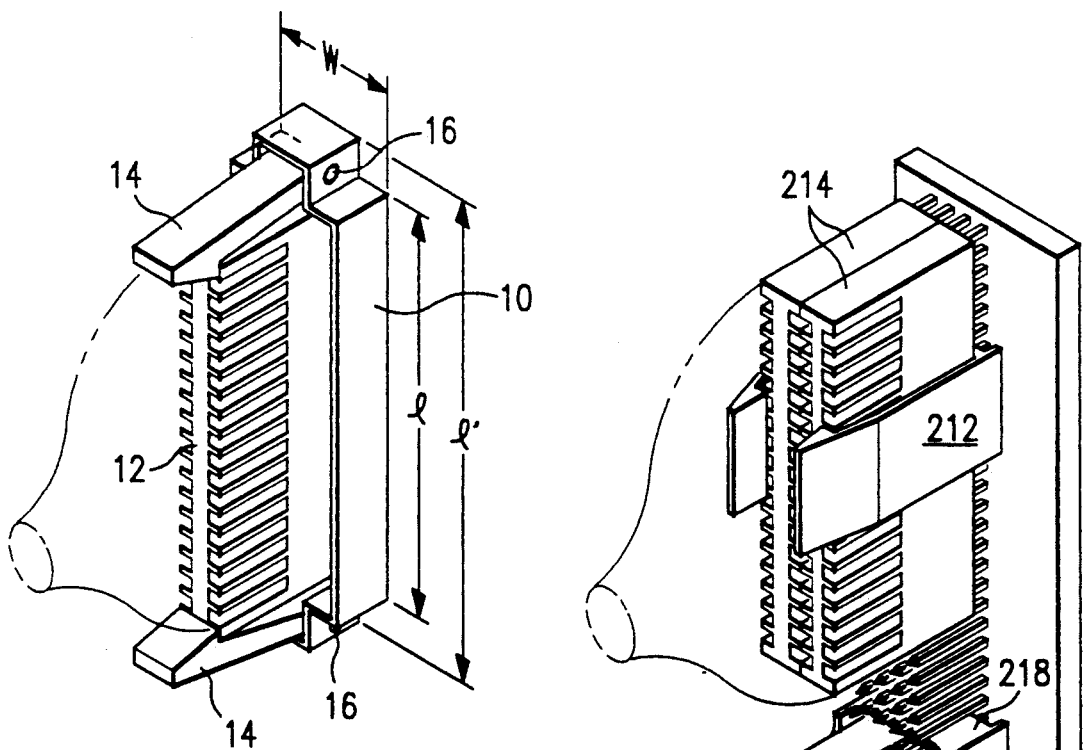
FIG. 1 depicts a latching shroud typical of the prior art.

FIG. 1 depicts a latching shroud 10 typical of the prior art. Latching shroud 10 accepts connector 12 for connection to a pinfield (hidden) of dimension w×1. Latching shroud 10 is coupled to a motherboard (not shown) directly, e.g. by adhesive or screws, or indirectly, by an interference fit between the base of the latching shroud 10 and the pinfield. Connector 12 is held in place by two latches 14. The latches 14 may pivot outward on axes 16 for removal of the connector 12 when desired.

One problem created by the prior art is its inefficient use of space on the motherboard. Connector 12 mounts to a pinfield only of size w×1 but the latching shroud 10 effectively occupies a pinfield of size w×1'. This design also precludes the use of the latching shroud on a continuous row of pins. Gaps must exist in the pinfield to accept the footprint of the two latches 14.

Another problem of the prior art is its high degree of complexity yet low flexibility. Shroud 10 contains several parts which typically require assembly during manufacture but is matable to only one particular connector size, here w×1. Also, latching shroud 10 is fabricated as a large single piece with two latching brackets. The central section of latching shroud 10, however, is not necessary. The two end areas of latching shroud 10 alone provide sufficient retention strength for connector 12.

Figure 2:
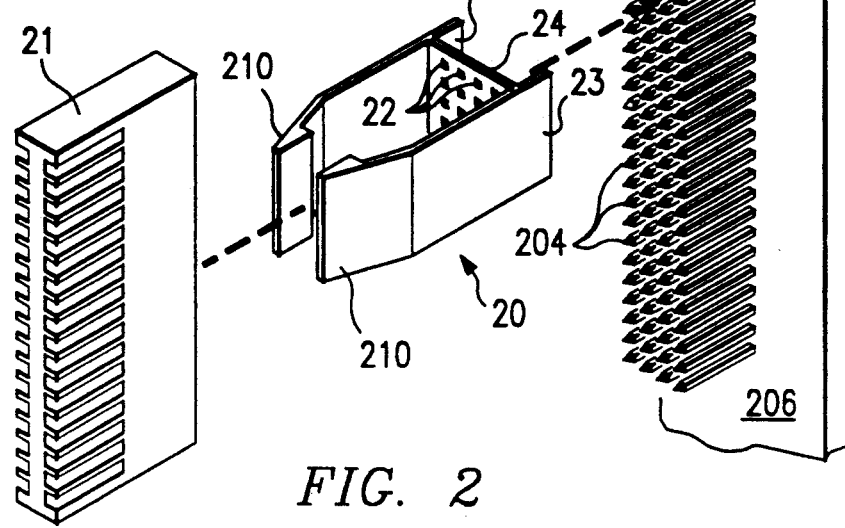
FIG. 2 shows a continuous pinfield with three latching shrouds mounted thereon, constructed in accordance with the present invention.

FIG. 2 depicts an improved latching shroud 20 which retains a connector, such as connector 21, to a pinfield, such as pinfield 204. Pinfield 204 projects from motherboard 206. A portion of pinfield 204 mates with a set of matching holes 22 in latching shroud 20. Shroud 20 has cross member 24 in which are constructed holes 22. Latching shroud 20 is secured to pinfield 204 and, hence, to motherboard 206 by an interference fit between holes 22 and pins 204. Bottom legs 23 are used for spacing as will be discussed.

When latching shroud 20 is inserted on pinfield 204, those pins covered by latching shroud 20 project through matching holes 22. Latching shroud 20 does not need to be the same length as connector 21 to insure a proper connection. Shroud 20 can accommodate connectors of various lengths. Connector 21 may be taller than, the same length as, or shorter than latching shroud 20. Hence, not all pins that mate with connector 21 pass through holes 22 of latching shroud 20.

Latching shroud 20 is designed to accommodate a full-width connector, a partial-width connector or a combination of partial-width connectors. Two arms 210 are angled inwards on latching shroud 20 to be able to retain a single partial-width connector. If instead, two connectors are installed in latching shroud 20, arms 210 flex outwards slightly to accommodate their width. Latching shroud 212, for instance, is mated with a 0.1 inch×0.1 inch pinfield 204 and accommodates two 2-pin-width connectors 214. Latching shroud 216 is mounted on pinfield 204 and accepts a single 2-pin-width connector 220.

Latching shroud 216 also contains a thin end member 218 connecting the two arms on one side. Member 218 provides a convenient reference point for the user to align connector 220 with the appropriate pins. The member 218 thus serves to "index" for future reference a set of desired pins on which a connector is to be inserted.

Figure 3:
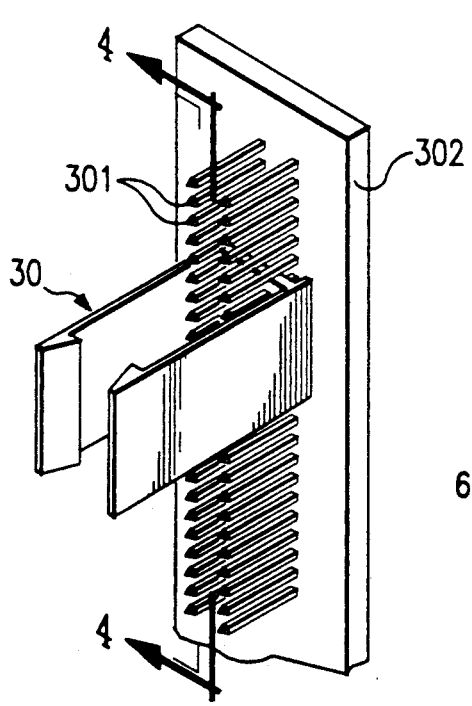
FIG. 3 also depicts a latching shroud constructed in accordance with the present invention.

The disclosed invention is adaptable to a wide variety of regular or irregular pinfield geometries. FIG. 3, for instance, depicts latching shroud 30 mounted on a pinfield 301 of wire-wrap tails protruding from backplane connector or motherboard 302. The pinfield forms a 0.1 inch×0.2 inch matrix. FIG. 2 depicts a regular 0.1 inch×0.1 inch pinfield. Shroud 30 of FIG. 3 is fabricated with straight arms because it is designed to accept a single two-pin-width connector (such as connector 21, FIG. 2). The arms, therefore, need not taper inwards as in FIG. 2.

The disclosed invention is also adaptable to mate unusually long connectors and continuous pinfields. Shrouds such as 20, 212 and 216, may be combined to provide pin alignment, height adjustment (discussed later) and cable retention over the entire length of a connector. Shroud 216 could be mounted on a target pinfield to indicate the first (or last) row of pins to mate with the connector. Another shroud, such as shroud 20, could be mounted further down (or up) the pinfield to provide support and guidance for the connector near its midpoint or other end. The two shrouds need not be contiguous but may be separated by a row or rows of bare pins. In a similar manner, any number of shrouds may be combined to provide support and guidance for any length of connector.

Figure 4:
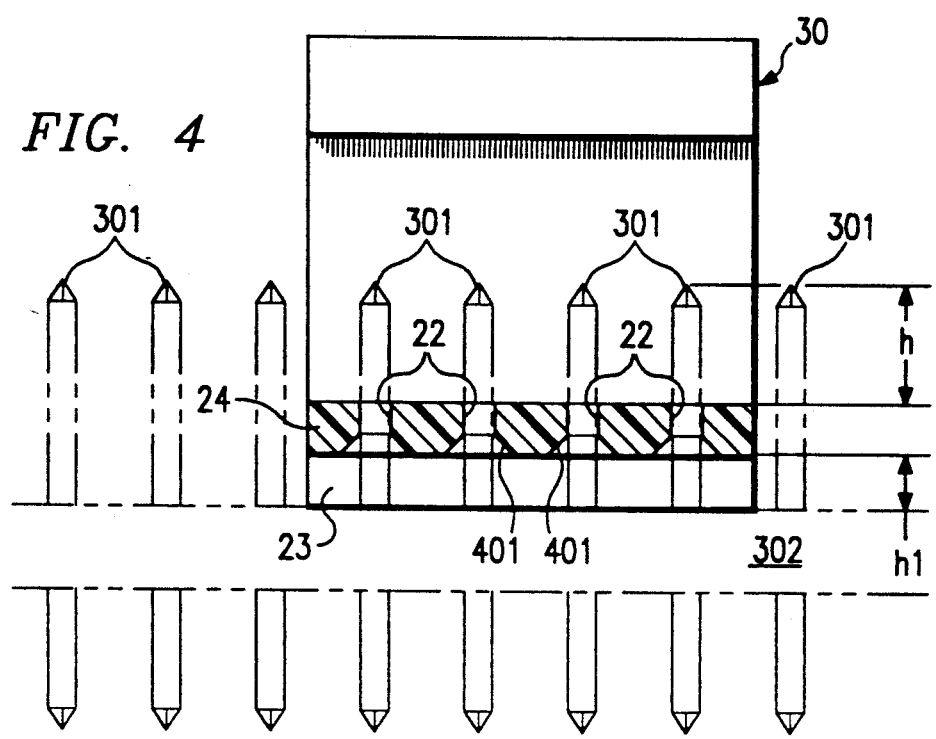
FIG. 4 shows a sectional view taken along the line 4—4 of FIG. 3.

FIG. 4, a cross section taken through the pinfield of FIG. 3, depicts how latching shroud 30 is properly positioned above motherboard 302. By adjusting the height, h1, of spacing leg 23, the height, h, of pins 301 protruding through holes 208 of latching shroud 30 can be adjusted. The value of h must be controlled to insure a proper connection between the connector (such as connector 220, FIG. 2) and pins 301. If h is too great, (h1 too small) the connector may be damaged when the pinfield is mated with the connector. If h is too small, (h1 too great) a proper electrical connection may not be made.

Member 23 can take several forms. For instance, member 23 could be the extension of each arm 210, as shown in FIG. 2. Member 23 could be a small washer or sets of washers inserted over mating pins 301 between motherboard 302 and latching shroud 30. Member 23 could also be a flat spacer placed on motherboard 302 before the latching shroud is inserted onto the pinfield.

FIG. 4 also depicts more clearly how holes 22 engage pins 301. Latching shroud 30 contains an enlarged opening 401 to initially guide pins 301 into the holes 22. Each hole 22 then tapers to a restricted passageway to create an interference fit with a mating pin 301.

Figure 5:
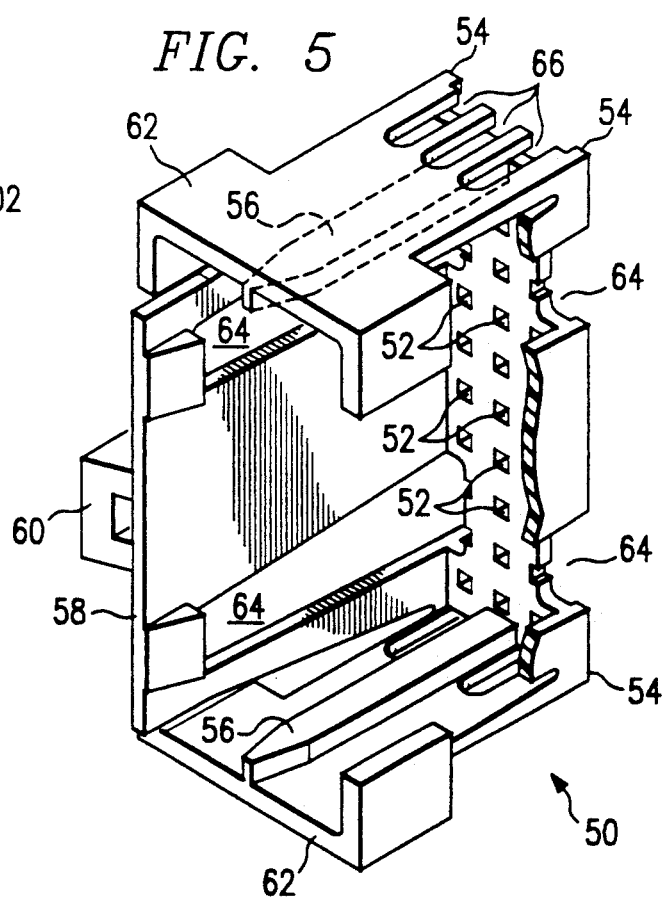
FIG. 5 shows a perspective view of one embodiment of the present invention.

FIG. 5 depicts a latching shroud 50 designed to retain two ten-pin connectors (not shown) on a 0.1 inch×0.1 inch pinfield (not shown). Latching shroud 50 is inserted onto a pinfield such that individual pins protrude through holes 52. An interference fit between the protruding pin and holes 52 retains the shroud 50 to the pinfield as described with respect to FIG. 4. Corner legs 54 act to space latching shroud 50 above the surface (not shown) from which the pinfield projects. Corner legs 54 thereby ensure a proper connection between pinfield and connector as explained with respect to FIG. 4. The two connectors are inserted onto the left and right columns of pins in latching shroud 50. Guiding members 56 align each connector with the appropriate group, or matrix, of pins. The center column of pins projects through the center column of holes but does not mate with any connector. Brackets 58 retain the connectors when mated to the pinfield. The right bracket has been removed from latching shroud 50 for clarity. Brackets 58 flex outwards when the connectors are initially mated to the pinfield and may be later expanded by the user by pressing outward on tab 60 to release the connectors.

Bracket stops 62 prevent brackets 58 from being flexed outwards (hyperflexed) beyond the elastic limit of the shroud material and provide support for guiding members 56. Cavities 66 on each end of shroud 50 allow shroud 50 to be mounted on a continuous pinfield by allowing a row of pins immediately above and below the shroud 50 to project normally. Without cavities 66 the footprint of bracket stops 62 would crush the row of pins below them. Side cut-outs 64 on each side of bracket 50 are incorporated into the design to allow efficient single piece fabrication of shroud 50.

Although the present invention has been described in detail, it should be understood that various changes, substitutions and alterations can be made hereto without departing from the spirit and scope of the invention as defined by the appended claims.

What is claimed is:

1. A shroud for retaining at least one connector, the connector containing at least one column of sockets for mating with a group of pins protruding from a surface, said shroud further comprising:

a base member containing a plurality of holes operable for receiving a portion of the group of pins, said holes having a tapering entry way with an opening larger than the pins leading to an exit way with cross-section substantially similar to the cross-section of the pins;

four leg members attached to said base, operable for causing said base to be positioned away from the surface;

two brackets attached to said base aligned parallel and facing each other across the width of said holes and operable by flexing away from each other for receiving the connector in a temporarily interlocked manner;

two bracket stops attached to said base aligned parallel to and facing each other across the length of said holes for preventing the hyperflexing of said brackets, said bracket stops each containing a plurality of cavities operable for receiving a plurality of the pins; and one member mounted on each of said bracket stops operable for guiding the connector to a particular matrix of said holes.

2. The method of attaching a connector with a first and second end to a pinfield, the method comprising the steps of:

mounting a first shroud on a first portion of the pinfield causing the first portion of the pinfield to protrude through the first shroud thereby creating an interference fit between the first portion of the pinfield and the first shroud;

mounting a second shroud on a second portion of the pinfield causing the second portion of the pinfield to protrude through the second shroud thereby creating an interference fit between the second portion of the pinfield and the second shroud;

mating the connector with at least part of both first and second portions of the pinfield;

engaging a locking mechanism on the first shroud with the first end of the connector; and engaging a locking mechanism on the second shroud with the second end of the connector.

3. The method of claim 2 further comprising the step of mounting at least one shroud on the pinfield to retain the connector between the first and second ends.

* * * * *